United States Patent
Kuo

(10) Patent No.: US 7,339,362 B2
(45) Date of Patent: Mar. 4, 2008

(54) ALTERABLE DC POWER SUPPLY CIRCUIT

(75) Inventor: Heng-Chen Kuo, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,669

(22) Filed: Sep. 8, 2006

(65) Prior Publication Data

US 2007/0115708 A1    May 24, 2007

(30) Foreign Application Priority Data

Nov. 18, 2005   (CN)   .................. 2002 1 0101540

(51) Int. Cl.
*G05B 24/02* (2006.01)
(52) U.S. Cl. .................................... 323/353; 323/354
(58) Field of Classification Search ............ 323/282, 323/284, 273, 274, 351, 352, 353, 354
See application file for complete search history.

(56) References Cited

U.S. PATENT DOCUMENTS 3,691,446 A * 9/1972 Ephraim et al. ............ 318/472
3,835,411 A * 9/1974 Carleson .................... 330/304

* cited by examiner

*Primary Examiner*—Jessica Han
(74) *Attorney, Agent, or Firm*—Wei Te Chung

(57) ABSTRACT

An alterable DC power supply circuit includes a regulator, a resistor, and an adjustable load resistance. The regulator includes a voltage input pin, a voltage output pin, and an adjusting pin. The resistor is coupled between the voltage output pin and the adjusting pin. The adjustable load resistance is coupled between the adjusting pin and ground. The output voltage of the alterable DC power supply is adjustable by adjusting the adjustable load resistance. Using this alterable DC power supply to test the voltage stability of a chipset improves testing efficiency.

6 Claims, 2 Drawing Sheets

ALTERABLE DC POWER SUPPLY CIRCUIT

FIELD OF THE INVENTION

The present invention relates to power supply circuits, and particularly to an alterable DC power supply circuit.

DESCRIPTION OF RELATED ART

The power requirements of electrical systems are becoming ever more demanding. To maximize energy efficiency, power density, and system serviceability, the power system designer is required to provide increased functionality and improved performance at minimal cost.

Frequently however, an electronic component may require a somewhat lower voltage than that provided by an AC/DC converter. Therefore, a DC power supply circuit is interposed between the AC/DC converter and the electronic component. This DC power supply circuit receives a 12V supply from the AC/DC converter, and outputs a DC supply at a suitably lower voltage (typically about 3.3 volts, depending on the particular electronic component in question).

FIG. 2 shows a conventional voltage regulating circuit 10. The voltage regulating circuit 10 includes a regulator 12 with a voltage input pin 3, a voltage output pin 2, and an adjusting pin 1, two resistors RF1 and RF2, and two capacitors C10 and C20. The resistor RF1 is coupled between the voltage output pin 2 and the adjusting pin 1 of the regulator 12. The resistor RF2 is coupled between the adjusting pin 1 of the regulator 12 and ground. The capacitor C10 is coupled between the voltage input pin 3 and ground. The capacitor C20 is coupled between the voltage output pin 2 and ground.

The voltage input pin 3 is coupled to a voltage input port VIN. The voltage output pin 2 is coupled to a voltage output port VOUT. The output voltage of the output port VOUT is found using the following equation: VOUT=VREF*(1+RF2/RF1), wherein VREF is a voltage at the resistor RF1. Generally, the resistance of the resistor RF1 is 125 Ohm, and the VREF is about 1.25V. The output voltage can be varied by according to the resistance of the resistor RF2 selected. Therefore, to adjust the output voltage of the voltage regulating circuit 10, the resistor RF2 must be replaced by an operator. It is inconvenient and inefficient in voltage stability testing of a chipset to use the voltage regulating circuit 10.

What is needed, therefore, is an alterable DC power supply circuit for adjusting output voltage effectively and conveniently.

SUMMARY OF THE INVENTION

An exemplary alterable DC power supply circuit includes a regulator, a resistor, and an adjustable load resistance. The regulator includes a voltage input pin, a voltage output pin, and an adjusting pin. The resistor is coupled between the voltage output pin and the adjusting pin. The adjustable load resistance is coupled between the adjusting pin and ground. The output voltage of the alterable DC power supply is adjustable by adjusting the adjustable load resistance.

Other advantages and novel features will become more apparent from the following detailed description when taken in conjunction with the accompanying drawings, in which:

DETAILED DESCRIPTION OF THE INVENTION

Figure 1:
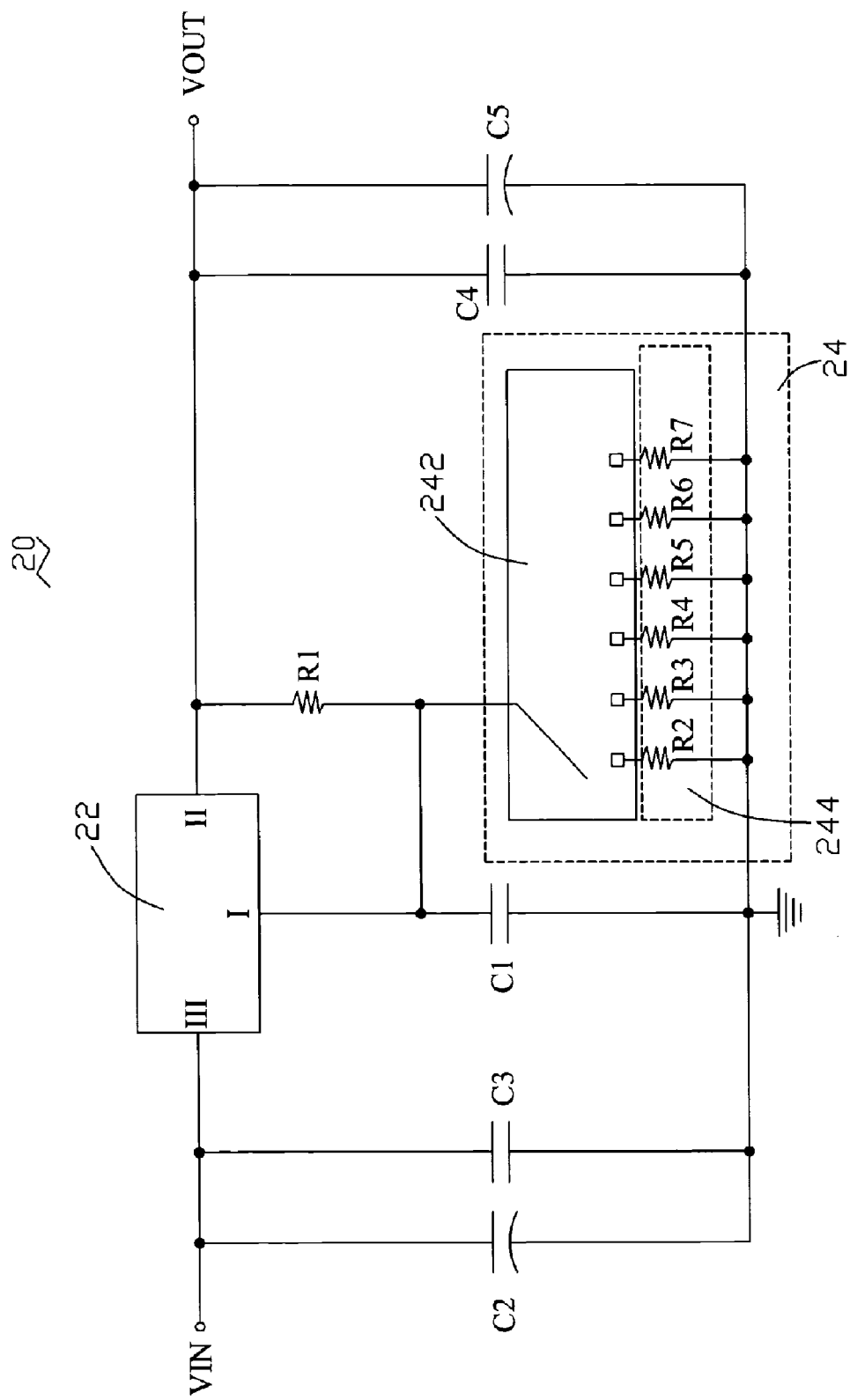
FIG. 1 is a circuit diagram of one embodiment of an alterable DC power supply circuit in accordance with the present invention.
Figure 2:
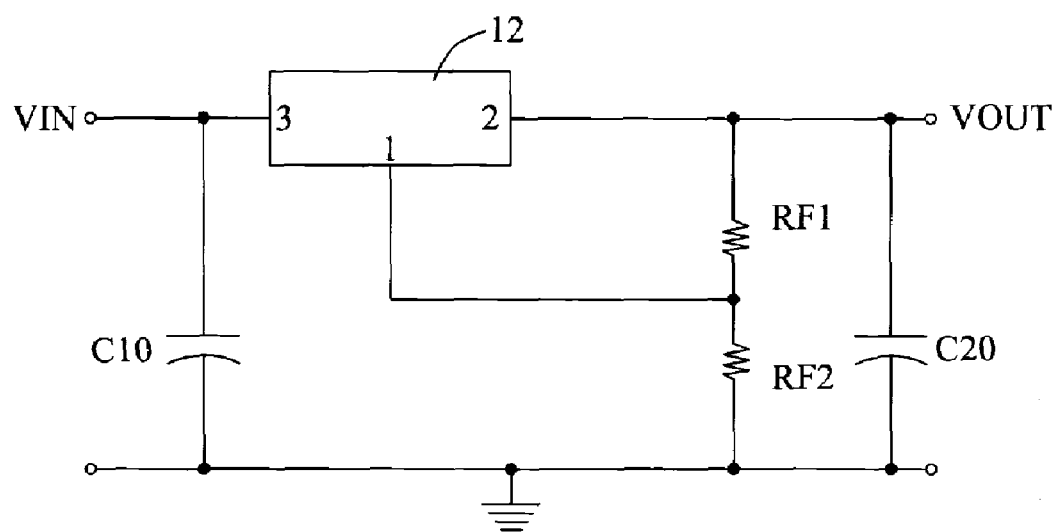
FIG. 2 is a circuit diagram of a conventional voltage regulating circuit.

Referring to FIG. 1, an alterable DC power supply circuit 20 in accordance with the present invention includes a regulator 22, a resistor R1, an adjustable load resistance 24, and five capacitors C1~C5.

The regulator 22 includes a voltage input pin III, a voltage output pin II, and an adjusting pin I. The voltage input pin III is coupled to a voltage input port VIN. The voltage output pin II is coupled to a voltage output port VOUT. The resistor R1 is coupled between the voltage output pin II and the adjusting pin I of the regulator 22. The adjustable load resistance 24 is coupled between the adjusting pin I and ground.

The capacitor C1 is coupled between the adjusting pin I and ground for regulating a voltage at the adjustable load resistance 24. The capacitors C2 and C3 are coupled between the voltage input pin 3 and ground in parallel for regulating a voltage input from the voltage input port VIN. The capacitors C4 and C5 are coupled between the voltage output pin 2 and ground in parallel for regulating a voltage output from the output pin II of the regulator 22.

In this embodiment, the resistance of the resistor R1 is 125 Ohm, and a voltage at the resistor R1 is 1.25V. Therefore, the output voltage of the output port VOUT is found using the following equation: VOUT=1.25*(1+RL/125). Wherein RL is the resistance of the adjustable load resistance 24. The output voltage is selectable by adjusting the resistance of the adjustable load resistance 24.

The adjustable load resistance 24 could be a sliding rheostat, a resistance box, or other adjustable resistor. In this embodiment of the present invention, the adjustable load resistance 24 includes a switch 242 and seven resistors R1~R7 of different pre-selected values, coupled between the switch and ground in parallel. The switch 242 includes a terminal connected to the adjusting pin, and another terminal selectively connected to one of the resistors R1~R7, and other ends of the resistors R1~R7 are connected to ground. Therefore, the output voltage is adjustable by controlling the switch 242 to select a suitable resistance RL from the resistors R1~R7 without having to replace a resistor. It is convenient and efficient in voltage stability testing of a chipset to use the alterable DC power supply circuit 20.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An alterable DC power supply circuit comprising:
   a regulator with a voltage input pin, a voltage output pin, and an adjusting pin;
   a resistor coupled between the voltage output pin and the adjusting pin;
   an adjustable load resistance coupled between the adjusting pin and ground for adjusting an output voltage output by the regulator; and
   a capacitor coupled between the adjusting pin of the regulator and ground for regulating voltage at the adjustable load resistance.

2. The alterable DC power supply circuit as claimed in claim 1, wherein the adjustable load resistance is a sliding rheostat.

3. The alterable DC power supply circuit as claimed in claim 1, wherein the adjustable load resistance is a resistance box.

4. The alterable DC power supply circuit as claimed in claim 1, wherein the adjustable load resistance comprises:
   a plurality of resistors arranged in parallel, each of the resistors having a terminal connected to ground, and another terminal; and
   a switch configured for selectively coupling the another terminals of the resistors to the adjusting pin of the regulator.

5. The alterable DC power supply circuit as claimed in claim 1, wherein at least one capacitor is coupled between the voltage input pin of the regulator and ground.

6. The alterable DC power supply circuit as claimed in claim 1, wherein at least one capacitor is coupled between the voltage output pin of the regulator and ground.

* * * * *